United States Patent [19]

Arnaune et al.

[11] Patent Number: 4,761,635
[45] Date of Patent: Aug. 2, 1988

[54] METHOD OF CODING DIGITAL INFORMATION ORGANIZED IN FRAMES USING A CMI CODE, A DEVICE FOR IMPLEMENTING THIS METHOD AND APPLICATION TO SERVITUDE INFORMATION FOR A HIGH CAPACITY DIGITAL NETWORK

[75] Inventors: Jean-Pierre Arnaune, Draveil; Nazario Dominguez, Paris; Jean Walraet, Lannion, all of France

[73] Assignee: S.A.T. (Societe Anonyme de Telecommunications), Paris, France

[21] Appl. No.: 932,371

[22] Filed: Nov. 19, 1986

[30] Foreign Application Priority Data

Nov. 19, 1985 [FR] France ................. 85 17037

[51] Int. Cl.⁴ .................................. H03M 5/14
[52] U.S. Cl. ....................... 340/347 DD; 370/102; 371/53
[58] Field of Search ............. 340/347 DD; 370/100, 370/102; 371/53; 375/17, 19, 20

[56] References Cited

U.S. PATENT DOCUMENTS 4,520,480  5/1985  Kawai ........................... 370/100

OTHER PUBLICATIONS

Yoshikai, Asamura and Katoh, "F-400M Line Terminal Equipment", *Review of the Electrical Communication Laboratories*, vol. 31, No. 3, (May 1983), pp. 253-258.
Kobayashi, Aida and Tokura, "Non-Repeated Submarine Optical Transmission Terminal Equipment", *Review of the Electrical Communication Laboratories*, vol. 31, No. 6, (Nov. 1983), pp. 844-852.
Horiguchi, Miki and Ishio, "F-32M and F-100M Fiber Optic Transmission Systems", *Japan Telecommunications Review*, vol. 23, No. 2, (Apr. 1981), pp. 125-134.
Kitami and Yoneda, "Line Codes and Repeater Fault Location Schemes for Optical Transmission Systems", *Electronics and Communications in Japan*, vol. 65, No. 4, (Apr. 1982), pp. 56-66.
Kihara et al., "Optical Data-Transmission Equipment for Computer Systems (Optical Data Mux)", *National Telecommunications Conference*, Nov. 29-Dec. 3, 1981, pp. G1.1.1-G1.1.5.

Primary Examiner—William M. Shoop, Jr.
Assistant Examiner—Richard K. Blum
Attorney, Agent, or Firm—Lowe, Price, LeBlanc, Becker & Shur

[57] ABSTRACT

A method is provided for coding in the CMI code digital information organized in frames, wherein each frame locking word V, chosen equal to 1, is placed in the last position in the frame. The CMI code is violated at the position of said word V and, for keeping the statistics of the coding law, it is arranged for this violation to be alternately 00 and 11, from one frame to another. For this, immediately before the word V is inserted a binary filling word B, chosen by taking into account the number of binary "1"s before filling. If the number of binary "1"s before filling is even, the binary element B is coded like the violation of the frame locking word V and, in the opposite case, B is coded 01.

9 Claims, 2 Drawing Sheets

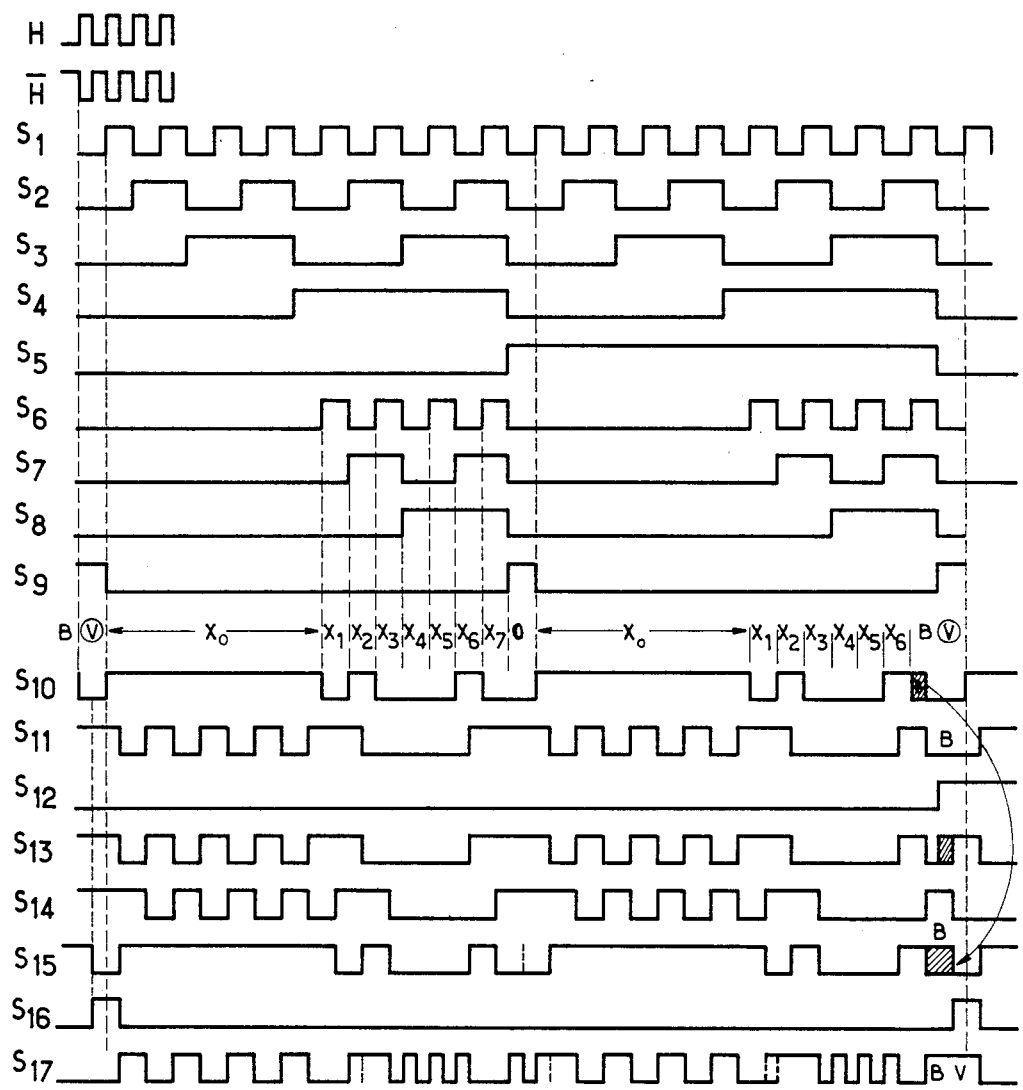
FIGURE_2_

METHOD OF CODING DIGITAL INFORMATION ORGANIZED IN FRAMES USING A CMI CODE, A DEVICE FOR IMPLEMENTING THIS METHOD AND APPLICATION TO SERVITUDE INFORMATION FOR A HIGH CAPACITY DIGITAL NETWORK

BACKGROUND OF THE INVENTION

The present invention relates to coding information using a CMI code and more particularly the coding of multiplexed digital information organized for example in frames.

The CMI code is well known. Such a code for example is described in the notice G 703 pages 55 to 57 of the CCITT such as reshaped in Geneva in 1980. The CMI code is a two level code without zero return of the signal. A binary 0 at the input is coded into a signal with level $A_1$ and $A_2$ (respectively low level and high level) in each half period (time T/2). A binary "1" at the input is coded into a signal of level $A_1$ or $A_2$ over a period, this level alternating for successive binary "1"s. The CMI code may be expressed more simply by saying that a binary "1" is coded 00 and 11 alternately and a binary "0" is coded 01.

However, when the binary train of information results from the multiplexing of a plurality of signals organized in frames, for recognizing these signals it is necessary to provide a frame locking word. Now, the insertion of such a word may disturb the statistics of the code itself.

SUMMARY OF THE INVENTION

The present invention aims at overcoming this drawback. For this, it provides first of all a method for coding digital information in the CMI code, in which said information is organized in frames, each comprising a position for a frame locking word V, in which method the binary element 1 is chosen for said word V, the CMI code is violated at the position of said word V and immediately before said word V is inserted a binary filling element B, said binary element B being chosen so that the statistics of the coding law are kept as a whole.

The invention proposes using as frame locking word a binary "1" placed at the end of a frame. This binary element V would then be coded in the CMI code 11 or 00. In order to recognize it, the CMI code is violated at the position of the frame locking word V by coding it 00 if it should be coded 11, or 11 if it should be coded 00.

However, coding of this word B does not take into account the useful information contained in the frame and the invention proposes, for respecting the statistics of the CMI coding law, to use the last but one binary element B of the frame, for filling each frame.

Advantageously, for keeping the statistics of the coding law as a whole, violation is chosen at the position of said word V alternately equal to 11 and 00, from one frame to the next, and said binary element B is chosen:

equal to 0 in the binary system if the number of "1"s of useful information of the frame before introduction of said binary elements B and V is uneven, equal to 1 in the binary system if said number is even.

In fact, the mean energy level of the signal may be disturbed if the statistics of the CMI code are not respected, that is to say if the number of binary "1"s coded 11 is different from the number of binary "1"s coded 00. In so far as the binary 0s are concerned, this problem does not exist because they are coded 01 in the CMI code.

The method of the invention for respecting the statistics of the coding law consists then essentially in searching in each frame for the parity of the number "1" and in coding the binary element "B", so that, when the number of binary "1"s before filling is even, the binary element B is coded identically to the frame locking binary element and when the number of binary "1"s before filling is uneven, the binary element is coded 01.

The invention also provides a particularly simple and efficient device for implementing the above method.

For this, it provides a device having means for coding, in the CMI code, a binary signal organized in frames each having a position for a frame locking word V, in which device:

said coding means are adapted so as to violate the CMI code at the position of said locking word V chosen equal to 1, means are provided for inserting, immediately before said word V, a binary filling element B and means are provided, responsive to the useful information contained in the frame for determining the value of said binary element B so that the statistics of the coding law are kept as a whole.

Advantageously:

means are provided for keeping the value of said binary signal at zero at the position of said word V, said coding means are adapted for inserting at the position of said word V, a violation alternatively equal to 11 and 00, from one frame to the next, said means for determining the value of said binary element B are adapted so that:

B=0 in the binary system if the number of "1"s of useful information of the frame before introduction of said binary elements B and V is uneven, B=1 in the binary system if said number is even.

Advantageously again:

said determination means include:

means for detecting the parity of said number, an exclusive OR gate receiving the output signal from said detection means and a signal representative of the coding of said violation, the output of said exclusive OR gate delivering a signal representative of the value of the binary element B.

The method of the invention applies in particular to the coding of servitude information such as monitoring, signalling, order channels, alarms, remote monitoring of high capacity digital transmission network, said information being multiplexed in frames.

This digital servitude channel, coded in accordance with the method of the invention, may then be applied in line in a way known per se for modulating a laser, for example.

BRIEF DESCRIPTION OF THE DRAWINGS

Other features and advantages of the invention will be clear from reading the following description illustrated by the drawings, in which:

FIG. 2 shows a diagram of the timing of the signals available at the output of the elements of the device of FIG. 1.

DESCRIPTION OF THE PREFERRED EMBODIMENT

Figure 1:
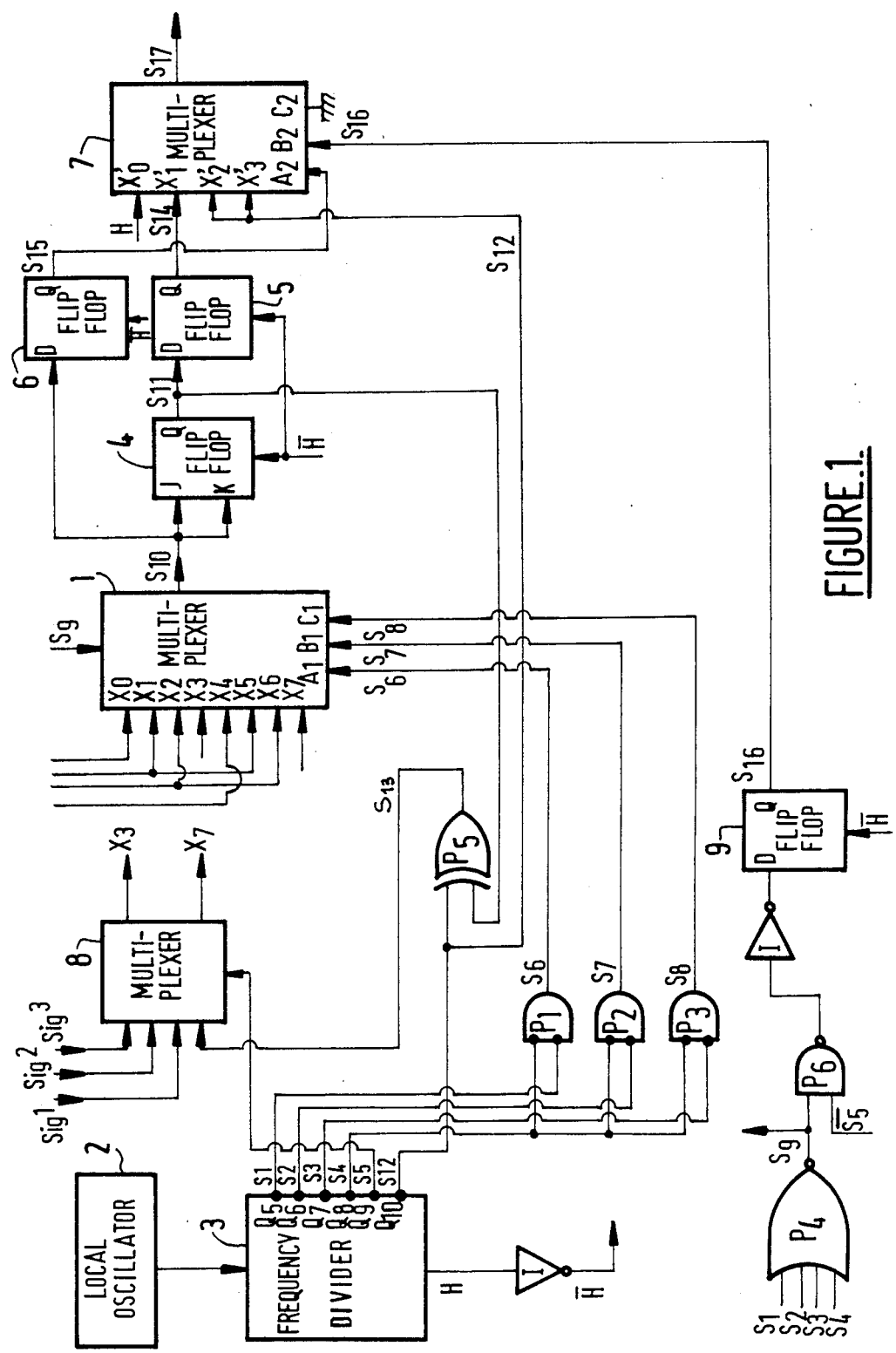
FIG. 1 is a diagram of the device for coding multiplexed information in the CMI code in a frame of 32 binary elements.

In the following description will be described the case of a frame of 32 binary elements, but the invention would similarly apply to a frame comprising any number of binary elements.

The method of coding in the CMI code of the invention consists, on the one hand, in choosing for frame locking word the last binary element of the binary frame and, on the other hand, in adopting a binary "1" for this framelocking word V. In addition, this frame locking word V is violated in its coding in the CMI code, that is to say that if it should, because of the last binary "1" of the frame, be coded 11 and not 00, it will not be coded in accordance with the CMI code as 11 but 00 and reciprocally. The method of coding the frame locking word V must further be adapted to the frame structure of the multiplexed information and, for the statistics of the CMI code, the coding of these violations should be alternated at each frame.

To fulfill all these requirements which are apparently difficult to make compatible, in accordance with the invention, in each frame, the last but one binary element B is used for on the one hand, fulfilling all these requirements relating to the frame locking word V and, on the other hand, for respecting the statistics of the CMI coding law. This binary element B is then a simple binary filling element and its coding depends then, on the one hand, on that of the frame locking word V which is imposed by that of the preceding frame and, on the other hand, on the useful information contained in the frame.

This binary filling word B may then, depending on the case, be coded, using the CMI code, 01, 11 or 00 depending on the needs. If, in the binary frame, the number of "1"s before filling is even, then the same value, in the CMI code, is adopted for B as for the frame locking word V.

On the other hand, if the number of "1"s in the binary frame before filling is uneven, the value 01, in the CMI code, is adopted for B.

The following frame examples illustrate the choice of the filling bit $B_2$ as a function of the frame locking word $V_2$ and of the useful contents of the frame, this word $V_2$ itself depending on the word $V_1$ of the preceding frame.

|  | Frame 1 | | Frame 2 | | | |
| --- | --- | --- | --- | --- | --- | --- |
|  | $V_1$ | | | | $B_2$ | $V_2$ |
| ex 1 | ... 11 | ... 00 | ... 11 | | 00 | 00 |
| ex 2 | ... 11 | ... 00 | ... 11 | ... 00 | 01 | 00 |
| ex 3 | ... 00 | ... 11 | ... 00 | | 11 | 11 |
| ex 4 | ... 00 | ... 11 | ... 00 | ... 11 | 01 | 11 |

It will be noted that, each time, $V_2$ is opposed to $V_1$. In example 1, $B_2$ is chosen equal to 00 for the number of binary "1"s is even therefore $B_2=V_2$. In example 2, $B_2$ is chosen equal to 01 for the number of binary "1"s in the frame is equal to three, therefore uneven. In example 3, the number of binary "1"s is equal to 2, therefore even and $B_2$ is coded equal to $V_2$. In example 4, the number of binary "1"s is equal to three, therefore uneven so $B_2$ is equal to 01. Only the binary "1"s have been shown and it has been assumed that the other binary information elements of the frame were binary "0"s, therefore coded 01 in the CMI code, so without any effect on the statistics.

Referring to FIG. 1, a multiplexer 1 receives the digital information $x_0,x_1,x_2,x_3,x_4,x_5,x_6,x_7$ in parallel. This information may for example be service information and has been previously coded in binary code. It may for example be a question of remote monitoring information, signalling, supervision information, order and alarm channels in a high capacity digital transmission network, comprising for example a laser emitter. This multiplexer 1 outputs information in series, at a suitable rate. The clock signal H, here of a frequency 128 Khz, is for example derived from a local oscillator 2, here of a frequency of 2.048 Mhz, through the divider circuit 3. Signal $\overline{H}$ is derived from H through the inverter I. The divider circuit 3 receives then the signal of frequency 2.048 Mhz and delivers at the outputs $Q_5,Q_6,Q_7,Q_8,Q_9$, and $Q_{10}$ the signals $S_1,S_2,S_3,S_4,S_5$, and $S_{12}$, respectively, derived from the input signal by dividing by 32, 64, 128, 256, 512 and 1024 respectively. The signals $S_1$ and $S_4$ are applied to the input of the AND gate $P_1$ so as to form a signal $S_6$ which is applied to the control input $A_1$, of lowest rank, of the multiplexer 1. The signals $S_2$ and $S_4$ are applied to the input of an AND gate $P_2$ which outputs a signal $S_7$ to the control input $B_1$, of the next rank, of multiplexer 1. Signals $S_4$ and $S_3$ are applied to the input of an AND gate $P_3$ so as to form the signal $S_8$ which is applied to the control input $C_1$, of the highest rank, of multiplexer 1. These different signals are shown in the timing diagram of FIG. 2. The multiplexer 1 may for example be a CMOS 4512 produced by Motorola. An inhibition signal $S_9$ is also applied to the inhibit input of this multiplexer 1. The use of this signal $S_9$ is related to the insertion of the locking bit V at the end of each frame as will be explained subsequently. This signal $S_9$ is for example generated by an $\overline{OR}$ gate $P_4$ which receives at its inputs the signals $S_1$, $S_2$, $S_3$, $S_4$ delivered by the divider circuit 3. This signal $S_9$ is a signal locating the position V of locking at the end of each frame, and in the particular example described, the sixteenth bit of each frame. It allows the state of the signal $S_{10}$ to be kept at 0 at the output of the multiplexer 1 at these locking positions V and here at the positions of the sixteenth bit of each frame.

This signal $S_{10}$ is applied simultaneously to the inputs J and K of a flip flop JK operating at the timing $\overline{H}$. This flip flop JK is insensitive to the binary "0"s applied at the input and only takes into account the binary "1"s, which each cause the change of its output signal $S_{11}$.

We may then say that the flip flop JK detects the parity of the numbers of the "1"s of the useful information of the frame before introduction of the binary elements B and V. This signal $S_{11}$ is applied, on the one hand, to the input of a type D flip flop 5 and, on the other hand, to the input of an exclusive OR gate $P_5$. This gate $P_5$ also receives the signal $S_{12}$. In fact, the signal $S_{12}$ is a parity signal of the violation of the frame locking word V which changes state at each frame. The signal $S_{11}$ is a signal recording the binary "1"s of the useful information signal (frame locking bit V excluded since the inhibit signal $S_9$ causes resetting of the signal $S_{10}$ at this position). Thus, at the output of gate $P_5$, the signal $S_{13}$ contains, at the position of the filling bit B, its binary value 0 or 1, depending on the parity of the number of 1s indicated by the signal $S_{11}$. It is therefore easy, as in the particular case of FIG. 1, to multiplex it previously with certain useful information, but it could also be applied directly to the input of the multiplexer 1.

Thus, as shown in FIG. 1, a multiplexer 8 here receives at four inputs information Sig 1, Sig 2, Sig 3, the nature of which will be discussed subsequently, and the filling bit B, so as to deliver at two outputs the data $x_3$ and $x_7$ to the input of the multiplexer. This multiplexer 8 is controlled by the signal $S_5$ from the divider circuit 3.

As was mentioned above, the binary signal $S_{11}$ at the output of the JK type flip flop 4 is applied to the input of type D flip flop 5, operating at the timing of clock $\overline{H}$, whose essential function is to deliver a signal $S_{14}$ identical to signal $S_{11}$, but phase locked with the clock signal $\overline{H}$. The binary signal $S_{10}$ is also applied to the input of a type D flip flop 6 so as to be there locked also with the clock $\overline{H}$ which gives the signal $S_{15}$. It can be seen that this signal $S_{15}$ is as a whole identical to the binary signal $S_{10}$, except for the filling bit B, which is inserted therein in true size whereas the bit B is only present for a half clock cycle on the signal $S_{10}$, because of the delay in the JK flip flop 4.

Finally, coding of the binary signal properly speaking is provided, according to the invention, by means of CMI coding circuit 7.

This circuit 7 is here a multiplexer, for example CMOS of type 4512 produced by Motorola. It receives at its inputs $x'_0$ and $x'_1$ clock signal H and the signal $S_{14}$, respectively and, at its combined inputs $x'_2$ and $x'_3$, the signal $S_{12}$.

The control signals for this multiplexer 7 are: at the control input $A_2$, of lowest rank, the signal $S_{15}$ and, on the control input $B_2$, of the next rank, a signal $S_{16}$ determining the position of the frame locking bit V, the control input $C_2$ of highest rank applied to zero. The signal $S_{16}$ is here derived from the signal $S_9$ by applying the signal $S_9$ to the input of an $\overline{AND}$ gate $P_6$ which also receives the signal $\overline{S_5}$ obtained by means of an inverter, not shown, from the signal $S_5$.

The output of gate $P_6$ is connected to the D input of a flip flop 9 after inversion of the signal in an inverter I. Flip flop 9 is clocked by the clock signal $\overline{H}$ and outputs the signal $S_{16}$. From the truth table of multiplexer 7 it may be deduced that $x'_0$ codes the binary "0"s by recopying the clock signal H whereas as $x'_1$ codes the binary "1"s. The inputs $x'_2$ and $x'_3$ code the locking bit V. At the output, the signal $S_{17}$ is obtained containing information organized in frames and coded in the CMI code in accordance with the invention.

It will be noted that, in the example shown in FIG. 1, the information applied to the inputs $x_1$ to $x_7$ of multiplexer 1 are partially premultiplexed, for example by means of the multiplexer 8. In fact, when it is a question for example of servitude information, formed for example by order, signalling, supervision, remote monitoring, alarm channels, etc . . . , the flow rates of each of these channels are unequal and a frame is organized as a function of the amount of information required for each service. If for example the overall flow of servitude information is fixed at 128 kbit/s, as in the example of the description, it is sufficient to divide the useful binary elements between the different servitudes. Thus we may attribute, in the example of the invention:

64 kbit/s for the omnibus audio channel (input $x_0$)

8 kbit/s for the remote monitoring channel (input $x_4$)

16 kbit/s for the order channel for the sake of security (inputs $x_1$ and $x_5$ connected together)

16 kbit/s for the supervision channel (inputs $x_2$ and $x_6$ connected together)

| | |
|---|---|
| 4 kbit/s for a first signalling channel (sig 1) | input $x_3$ |
| 4 kbit/s for a second signalling channel (sig 2) | |
| 4 kbit/s for a signalling channel RON/TRON of the audio channel (sig 3) | input $x_7$ |
| 4 kbit/s for the filling bit B | |
| 4 kbit/s for the locking bit V. | |

In the particular case which has just been described considering the fact that the signal $S_9$ is at level 1 at the position of the sixteenth bit of the frame, the signal $S_{10}$ is necessarily at zero during this sixteenth bit, which could be used for upstream fault signalling, for example. The insertion of such signalling downstream of multiplexer 1, not shown for the sake of simplicity, is within the scope of a man skilled in the art. Naturally, a high level signal could be produced and applied, to the inhibition input of multiplexer 1, only during the locking word V, and the upstream fault signalling could then be inserted at input $x_0$, at the time of the sixteenth bit of the frame.

With such multiplexing, using the CMI coding of the invention, a frame may be obtained having 32 binary elements for servitude channels of a high capacity transmission network.

Such a frame structure may obviously be modified for adapting it to the number of channels to be multiplexed, to the in line flow rate, and a frame may be obtained having any number of binary elements.

The choice of the 128 kbit/s rate has a quite particular interest for the servitude channel. In fact, as mentioned in the French patent No. 2 526 554 of the applicant, such a digital signal may serve for frequency overmodulating a laser emitter. This 128 kbit/s rate is certainly a constraint for this very particular application of forming a frame for digital information coded in the CMI code.

What is claimed is:

1. A method of coding digital information in a CMI code, comprising the steps of:
    organizing said digital information in frames, each said frame having inserted therein a frame locking word comprising a binary "1" positioned at the end of said frame whereby the CMI code as a result of said insertion of said locking word is violated; and
    inserting a binary filling element into said frame immediately before said frame locking word so that statistics of said CMI code are maintained.

2. The method of claim 1, further comprising the steps of coding said locking word alternately as "11" and "00" from one frame to the next;
    coding said binary filling element as binary "0" when the number of binary "1"s in said frame is an odd number before the insertion of said frame locking word; and
    coding said binary filling element as binary "1" when the number of binary "1"s in said frame is an even number before the insertion of said frame locking word.

3. A method of coding digital servitude information such as supervision, signalling, order channels, alarms, or remote monitoring of a high capacity digital network in the CMI code, said coding of said digital servitude information comprising the steps of:
    multiplexing said digital servitude information;
    organizing said multiplexed digital information in frames, each said frame having inserted therein a frame locking word comprising a binary "1" positioned at the end of said frame whereby the CMI code as a result of said insertion of said locking word is violated;

inserting a binary filling element into said frame immediately before said frame locking word so that statistics of said CMI code are maintained;

said method further comprising the steps of coding said locking word alternately as "11" and "00" from one frame to the next;

coding said binary filling element as binary "0" when the number of binary "1"s in said frame is odd before the insertion of said frame locking word; and coding said binary filling element as binary "1" when the number of binary "1"s in said frame is even before the insertion of said frame locking word.

4. The method of coding digital servitude information of claim 3, further comprising the step of laser modulating said multiplexed digital servitude information.

5. Appatatus adapted for coding digital information in a CMI code, comprising:

means for organizing said digital information in frames, each said frame having a frame locking word inserted therein at the end of said frame;

means for generating said locking word according to said CMI code;

means for inserting said locking word; and means for inserting a binary filling element into said frame immediately before said frame locking word according to statistics of said CMI code to maintain the integrity of said CMI code.

6. The apparatus of claim 5, further comprising means for coding said locking word altenately as "11" and "00" from one frame to the next;

means for coding said binary filling element as binary "0" when the number of binary "1"s in said frame is odd before the insertion of said frame locking word; and means for coding said binary filling element as binary "1" when the number of binary "1"s in said frame is even before the insertion of said frame locking word.

7. The apparatus of claim 6, wherein said means for coding said binary filling element comprises:

parity detection means; and exclusive OR gate means for receiving the output of said parity detection means and an output of said means for coding said locking word.

8. The apparatus of claim 7, wherein said parity detection means comprises JK type flip-flop means, said JK type flip-flop means comprising J and K input terminals connected together.

9. The apparatus of claim 7, further comprising:

clock circuit means outputting a clock signal for coding binary 0's;

first means for phase locking said output of said parity detection means, and for outputting a signal for coding binary 1's;

second means for phase locking said digital information; and multiplexer means for generating a multiplexed signal, said multiplexer means having operation controlling inputs receiving the output of said second phase locking means and receiving said frame locking word; and said multiplexer means generating a multiplexed signal coded in said CMI code.

* * * * *